United States Patent

Forester et al.

[11] Patent Number: 5,952,243
[45] Date of Patent: Sep. 14, 1999

[54] REMOVAL RATE BEHAVIOR OF SPIN-ON DIELECTRICS WITH CHEMICAL MECHANICAL POLISH

[75] Inventors: Lynn Forester, San Jose; Dong K. Choi, Campbell; Reza Hosseini, Fremont, all of Calif.

[73] Assignee: AlliedSignal Inc., Morristown, N.J.

[21] Appl. No.: 08/669,184

[22] Filed: Jun. 24, 1996

Related U.S. Application Data

[60] Provisional application No. 60/000,515, Jun. 26, 1995.

[51] Int. Cl.$^6$ .................................................. H01L 21/463
[52] U.S. Cl. ......................... 438/693; 438/692; 438/699; 438/747; 216/38; 216/52; 216/89; 216/90; 216/99
[58] Field of Search .................................. 216/38, 52, 89, 216/90, 99; 438/692, 693, 699, 747

[56] References Cited

U.S. PATENT DOCUMENTS

| | | | |
|---|---|---|---|
| 4,222,792 | 9/1980 | Lever et al. | 148/1.5 |
| 4,789,648 | 12/1988 | Chow et al. | 437/225 |
| 4,944,836 | 7/1990 | Beyer et al. | 156/645 |
| 5,302,233 | 4/1994 | Kim et al. | 156/636 |
| 5,312,512 | 5/1994 | Allman et al. | 156/636 |
| 5,397,741 | 3/1995 | O'Connor et al. | 437/187 |
| 5,447,874 | 9/1995 | Grivna et al. | 437/40 |
| 5,449,314 | 9/1995 | Meikle et al. | 451/41 |
| 5,516,729 | 5/1996 | Dawson et al. | 437/228 |
| 5,525,191 | 6/1996 | Maniar et al. | 156/636.1 |
| 5,612,254 | 3/1997 | Mu et al. | 437/195 |

OTHER PUBLICATIONS

Research Disclosure No. 328, August 1991, p. 583 Preimidization Chemical Mechanical Polishing of Polyimide Coatings.

Sivaram et al., Solid State Technology, vol. 35, No. 5, May 1992, pp. 87–91, "Planarizing Interlevel Dielectrics by Chemical–Mechanical Polishing".

Homma et al., Feb. 22–23, 1996 CMP–MIC Conference, pp. 67–73, "Selective CMP of Organic SOG for Low Parasitic Capacitance Quarter–Micron, Multilevel Interconnections".

*Primary Examiner*—Nam Nguyen
*Assistant Examiner*—Steven H. Ver Steeg
*Attorney, Agent, or Firm*—Leslie Weise

[57] ABSTRACT

A method for forming a gap-filled, planarization structure of dielectric materials on a substrate topography useful for forming microelectronic devices. A dielectric material is first deposited as continuous, dry dielectric layer, preferably a SOG layer. Then the dielectric layer is partially removed by chemical-mechanical polishing (CMP). The chemical and mechanical properties of the structure can be chosen by varying the composition of the SOG layer and the subsequent CMP conditions.

18 Claims, 12 Drawing Sheets

BEFORE CMP

AFTER CMP

AFTER THERMAL CURE (60min @ 425°C, N2)

AFTER CMP WITH SC-112

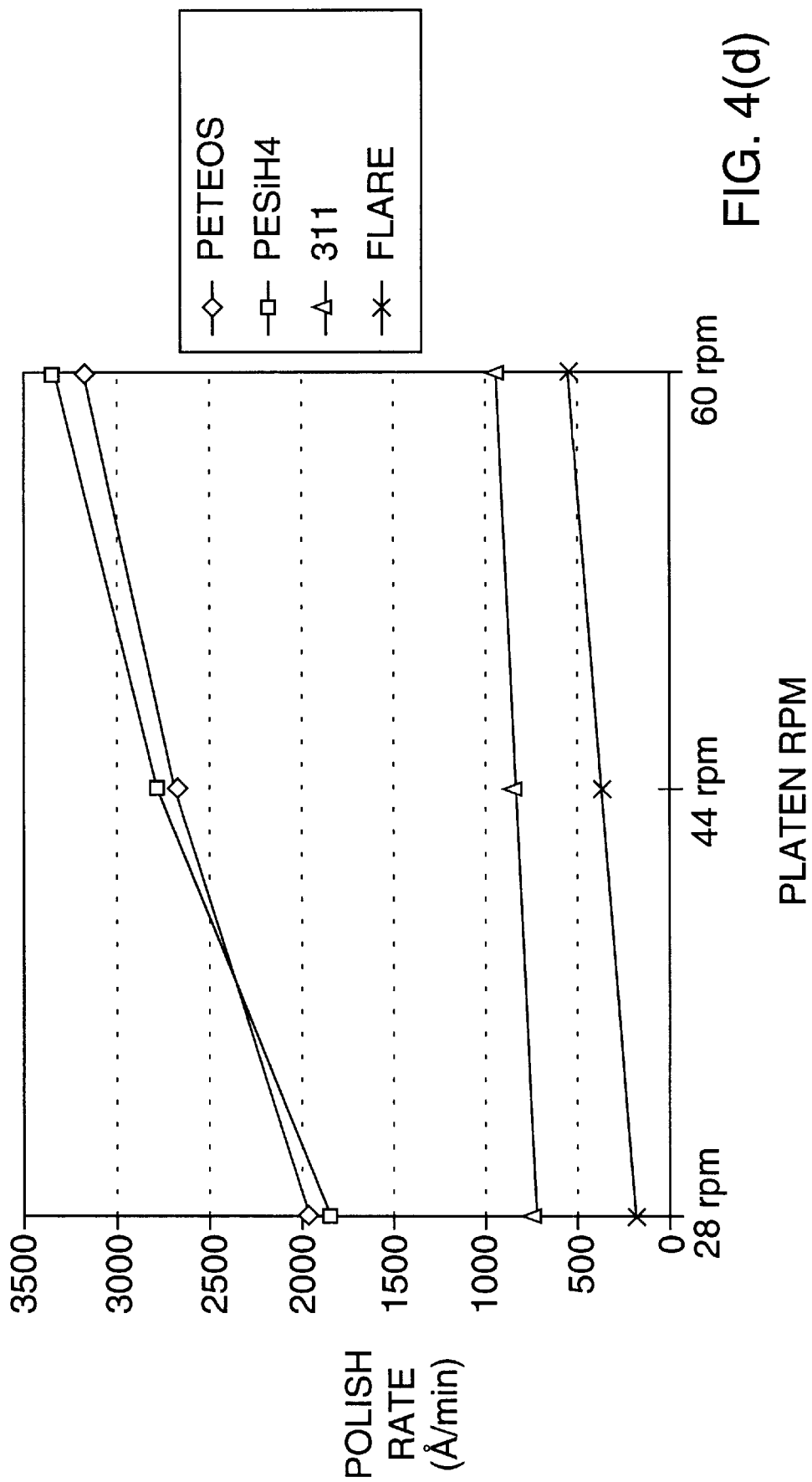

AFTER CMP
LOCAL & GLOBAL PLANARIZATION ON THE SAME WAFER

REMOVAL RATE BEHAVIOR OF SPIN-ON DIELECTRICS WITH CHEMICAL MECHANICAL POLISH

CROSS REFERENCE TO RELATED APPLICATION

This application claims the benefit of U.S. provisional application Ser. No. 60/000,515, filed Jun. 26, 1995 (pending) which is incorporated herein by reference.

BACKGROUND OF THE INVENTION

1. Field of the Invention

The present invention relates to the preparation of substrates used in the manufacture of integrated circuits ("IC"), multichip modules, printed circuit boards, high-speed logic devices, flat panel displays, and other microelectronic devices. More particularly, the invention pertains to an improved technique for filling surface voids, leveling spaces between metal contacts and planarizing dielectric layers of substrates suitable for use in the manufacture of the above submicron size devices. This is done using spin-on glass materials together with a chemical mechanical polishing process.

2. Description of the Prior Art

A continuing trend in semiconductor technology is the formation of integrated circuit chips having more and faster circuits thereon. Such ultralarge scale integration has resulted in a continued shrinkage of feature sizes with the result that a large number of devices are available on a single chip. With a limited chip surface area, the interconnect density typically expands above the substrate in a multi-level arrangement and the devices have to be interconnected across these multiple levels. The interconnects must be electrically insulated from each other except where designed to make contact. Usually electrical insulation requires depositing or spinning-on dielectric films onto a surface. See, i.e., "Spin/Bake/Cure Procedure for Spin-On-Glass Materials for Interlevel and Intermetal Dielectric Planarization" brochure by AlliedSignal Inc. (1994)(thermally cured spun-on films).

A key processing difficulty associated with the formation of local interconnects is the topography of the device surface. Not only is the substrate surface itself quite nonplanar, but device forming processes additionally create topographical irregularities such as gaps thereon. Loss of planarity can cause many problems which can adversely impact manufacturing yield including failure to open vias due to interlevel dielectric thickness disparity, poor adhesion to underlying materials, step coverage, as well as depth-of-focus problems. Thus the ability to fill narrow gaps in IC substrates is critical for forming sub-micron size elements thereon. Various substrate gap filling techniques known in the art include deposit-etch-deposit cycles, and applications of Sub-Atmospheric Tetra-Ethyl Ortho Silicate (SATEOS), Atmospheric Plasma Tetra-Ethyl Ortho Silicate (APTEOS), Chemical Vapor Deposition (CVD), High Density Plasma (HDP) systems and spin-on glass (SOG) materials. The technique employing the application of SOG materials is more economic than the other above equipment-intense techniques.

Other critical concerns in IC substrate processing include regional and global dielectric planarization. The planarization or smoothing of surfaces is essential in the fabrication of integrated circuits. As optical lithography techniques are used to define smaller and smaller features, the depth of focus of the exposure tool decreases. Therefore, it is necessary to employ planarizing films to smooth or "level" the topography of microelectronic devices in order to properly pattern the increasingly complex integrated circuits. IC features produced using photolithographic techniques require regional and global dielectric planarization where the lithographic depth of focus is extremely limited, i.e., at 0.35 $\mu$m and below. Without sufficient regional and global planarization, the lack of depth of focus will manifest itself as a limited lithographic processing window.

One method for improving the planarization of IC surfaces includes chemical-mechanical polishing ("CMP"). Thus CMP has a unique advantage in that it can rapidly remove elevated topographical features without significantly thinning flat areas. CMP can reduce more of applied oxide coating thicknesses in raised areas than in recessed areas since the raised areas have a greater surface contact with the polishing pad and thus can be abraded to a greater extent than recessed areas. By applying mechanical as well as chemical abrasion to the upper surfaces, CMP achieves greater planarization than that obtained by conventional etching.

While planarization can be achieved with CMP, its use does not eliminate the need for gap-filling. It has been heretofore believed that the use of SOG and CMP techniques were mutually exclusive processes. This is because of the common belief that SOG layers are porous and hence the polish rate of SOG would be much higher than that of other gap-filling processes.

It would be desirable to provide an improved process for forming continuously uniform microelectronic substrates whereby the substrate would be essentially void-free, the metal contacts would be effectively insulated, and the layers would be effectively planarized.

SUMMARY OF THE INVENTION

The invention provides a process for forming a void-free, continuous planarized substrate surface comprising:
 (a) applying a dielectric composition to a surface of a substrate in an amount sufficient to uniformly coat and fill voids on the surface; and
 (b) performing a chemical mechanical polishing step to said dielectric composition until said dielectric composition on said substrate surface is substantially planarized.

The process may further comprises the subsequent steps of repeating steps (a) and (b) at least once to the planarized substrate surface.

The invention also provides a process for treating a semiconductor substrate surface comprising:
 a) spin depositing a layer of a liquid dielectric composition onto a surface of a semiconductor substrate;
 b) heating said dielectric layer at a temperature and for a time sufficient to form a continuous, dry dielectric layer on the surface; and
 c) chemical-mechanical polishing the dielectric layer to remove at least a portion of the dielectric layer.

BRIEF DESCRIPTION THE DRAWINGS OF

Figure 7A:
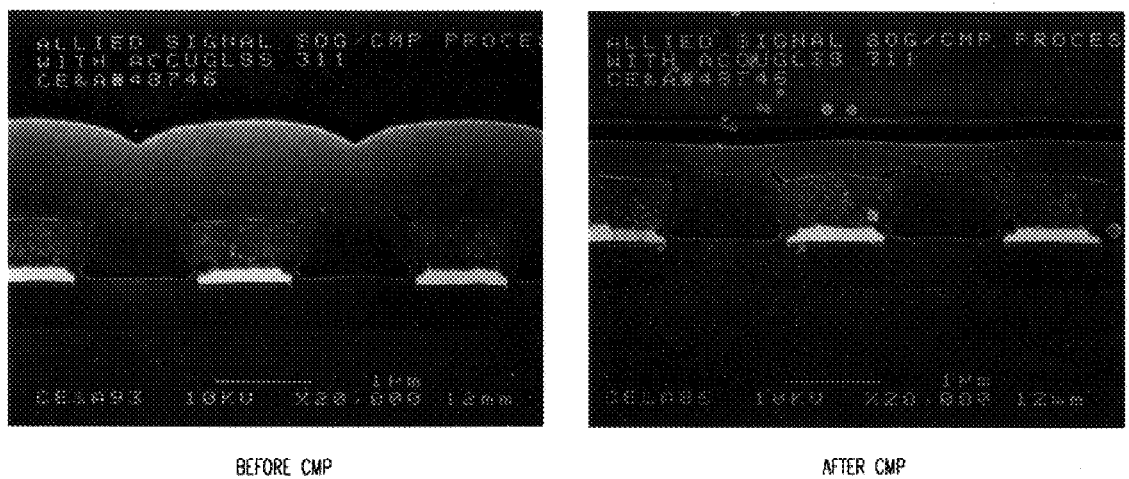
Figure 7B:
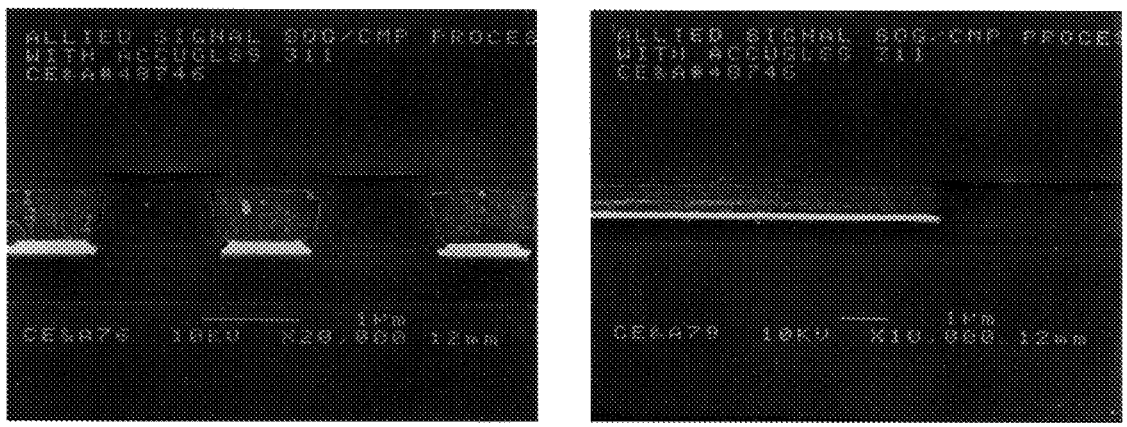

FIGS. 7(a) and (b) show wafer surfaces by scanning electron microscopy (SEM) micrograph to present the surface condition of wafers before and after CMP.

Figure 8:
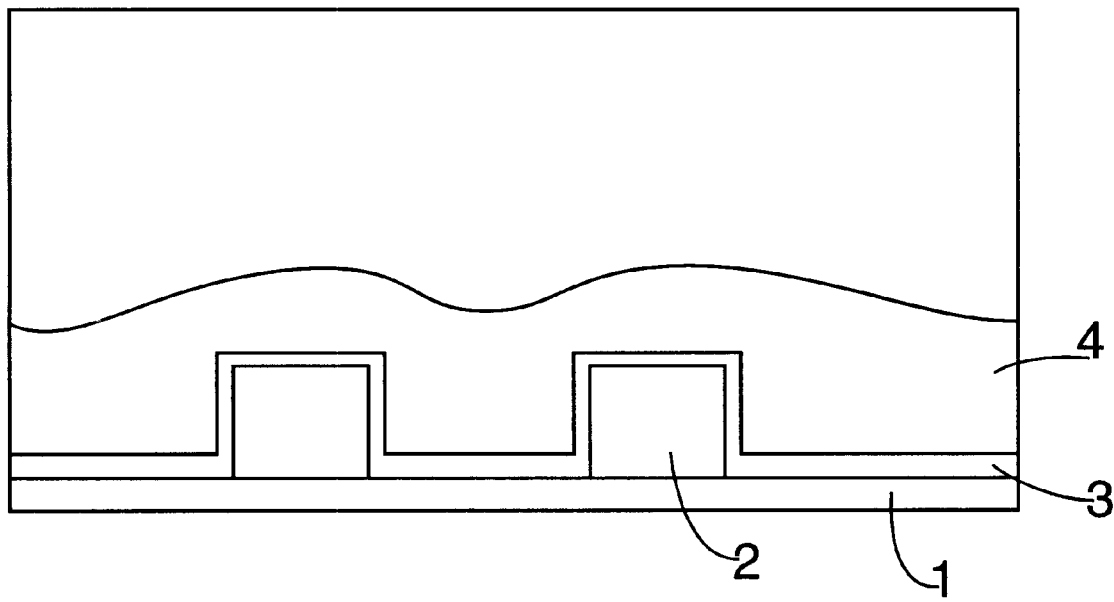

FIG. 8 shows a substrate having a pattern of metal contacts on which is deposited a CVD layer and an SOG layer, respectively.

Figure 9:
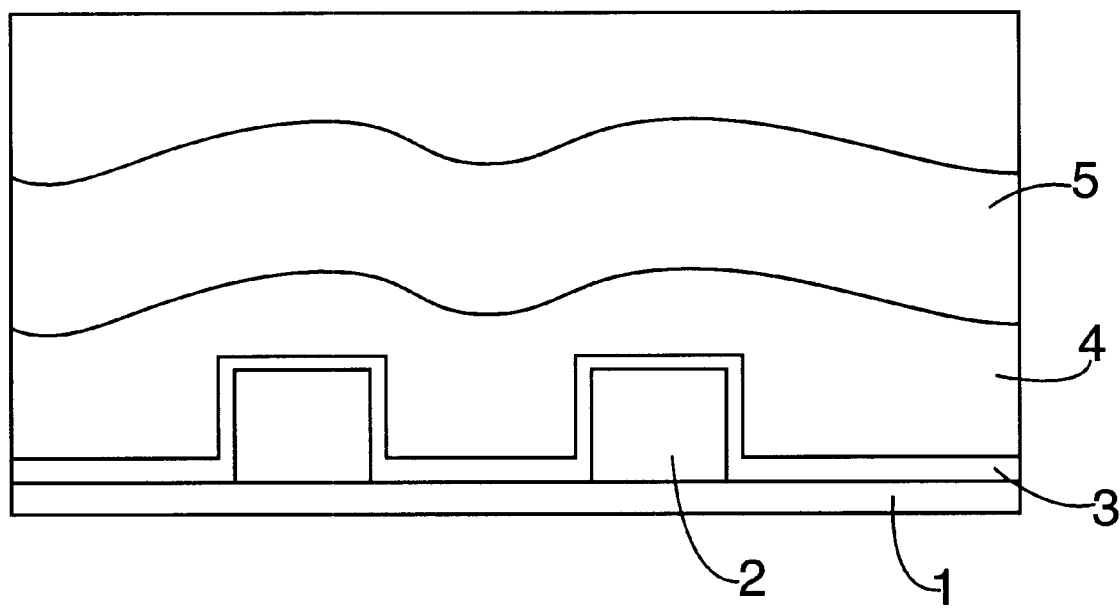

FIG. 9 shows a substrate having a pattern of metal contacts on which is deposited a CVD layer, an SOG layer an additional CVD layer, respectively.

DETAILED DESCRIPTION OF THE PREFERRED EMBODIMENT

In its broadest embodiment, the process includes the steps of providing an upper surface of a semiconductor substrate with a dielectric layer. Thereafter, CMP is conducted to remove at least a portion of the dielectric layer in an amount sufficient to formed a planarized layer on the substrate.

Typically the dielectric compositions are applied onto wafer substrates, which are to be processed into an IC or another microelectronic device. Suitable planar substrates for the present invention non-exclusively include gallium arsenide (GaAs), silicon and compositions containing silicon such as crystalline silicon, polysilicon, amorphous silicon, epitaxial silicon, and silicon dioxide (SiO$_2$) and mixtures thereof, which may or may not have a circuit pattern on their surface. Typically, the substrates have a diameter in the range of from about 2 inches to about 12 inches, although the present invention would still be effective for larger or smaller substrates.

The surface of the substrate may comprise a pattern of metallic electrical conductors or both a pattern of metallic electrical conductors and a layer of an oxide on the metal conductors. In another embodiment of the process of the invention, the surface comprises a pattern of metallic electrical conductors and a layer of an oxide on the metal contacts and the process further comprises depositing a second oxide layer on the dielectric layer before conducting step (b).

One applies a liquid dielectric layer, preferably a spin-on glass (hereinafter SOG) such as a silicate or siloxane in a suitable solvent, to the substrate surface under ambient conditions. Suitable solvents non-exclusively include water and organic solvents in an amount sufficient to form a uniform solution or dispersion of the dielectric material.

A wide variety of commercially available dielectric materials may be used for this purpose. Illustrative of such suitable dielectric materials which may be spun-on to substrates include, but are not limited to, silicates, phosphosilicates, siloxanes such as phenylsiloxanes, methylsiloxanes, methylphenylsiloxanes, phosphosiloxanes, silsesquioxane, methyl silsesquioxane, methylphenyl silsesquioxane, and organic polymers such as fluorinated polymers, in particular fluorinated poly(arylethers) available under the tradename Flare™ from AlliedSignal Inc., and copolymers mixtures thereof. Organic dielectrics, i.e. those containing carbon atoms are preferred and siloxanes and fluorinated poly(arylethers) are more preferred. Preferred siloxanes are amorphous, crosslinked glass-type materials having the formula SiOx wherein x is greater than or equal to one and less than or equal to two, and have, based on the total weight of the siloxane materials, from about 2% to about 90%, and preferably from about 10% to about 25% of organic groups such as alkyl groups having from about 1 to about 10 carbons, aromatic groups having from about 4 to about 10 carbons, aliphatic groups having from about 4 to about 10 carbons, and mixtures thereof Optionally, the siloxane and silicate materials may also contain phosphorus in an amount from about 0% to about 10%, and preferably from about 2% to about 4% based on the total mol percent of the dielectric materials. Preferred siloxane materials suitable for use in this invention are commercially available from AlliedSignal Inc. under the tradename Accuglass®.

Suitable siloxane materials contain about 100 parts per billion or less, preferably 50 parts per billion or less, and more preferably 10 parts per billion or less of trace element impurities such as sodium, potassium, chlorine, nickel, magnesium, chromium, copper, manganese, iron, calcium, and the like, and preferably have a molecular weight of from about 1,000 to about 50,000, and more preferably from about 300 to about 1,000 molecular weight units.

In the preferred embodiment, the dielectric materials have a viscosity when applied ranging from about 0.8 to about 70 cP, a percent solids when applied ranging from, based on the total weight of the dielectric material, solvent and water, about 3% to about 36% and a water content of from about 0 to about 11%, a dielectric constant of about 10 or less, preferably from about 2.4 to about 3.2, and a refractive index of from about 1.37 to about 1.65.

The dielectric material may be applied to the substrates via conventional spin-coating, dip coating, spraying, or meniscus coating methods which are well-known in the art. Details of such methods are described in, for example, "Processing Equipment and Automated Systems", a brochure by Integrated Technologies. Spin-coating is most preferred. The thickness of the dielectric film on the substrate may vary depending on the amount of liquid dielectric that is applied to the substrate, but typically the thickness may range from about 500 Å to about 2 microns, and preferably from about 3000 Å to about 9000 Å. The amount of dielectric liquid applied to the substrate may vary from about 1 ml to about 10 ml, and preferably from about 2 ml to about 8 ml.

In the preferred embodiment, the liquid material is spun onto the upper surface the substrate according to known spin techniques. Preferably, the dielectric is applied from a solution which is centrally applied to the substrate and then spun on a rotating wheel at speeds ranging between about 500 and about 6000 rpm, preferably between about 1500 and about 4000 rpm, for about 5 to about 60 seconds, preferably about 10 to about 30 seconds, in order to spread the solution evenly across the substrate surface. Once placed, the liquid dielectric composition fills valleys or crevices both in the substrate and between densely spaced metal conductors on the substrate to provide a smoothing effect which does present some planarization in the crevices, however, not enough to fully planarize that area.

After the dielectric material is applied to the substrate, the dielectric-substrate combination is optionally, but preferably heated for a time and at a temperature sufficient to evaporate any residual solvent present within the dielectric film, to further reduce the viscosity of the film, and to enhance leveling of the film on the substrate, and to increase or decrease the density, chemical resistance properties and/or physical abrasion resistance properties of the film, as may be determined by one skilled in the art without undue experimentation. A change in the density and chemical properties of the dielectric affords a change in its susceptibility to CMP removal. An increase in temperature or exposure time to heat will incrementally change the chemical and mechanical properties of the dielectric layer thereby bringing about a change in CMP removal rate. Removal can be fixed at a higher or lower rate according to the properties of the dielectric layer material and the particular CMP chemical slurry and mechanical pressure conditions being applied.

Generally, the dielectric coated substrate is heated at a temperature of from about 50° C. to about 400° C., more preferably from about 50° C. to about 250° C. for about 0.5 to about 10 minutes, more preferably from about 1 to about 3 minutes. This is preferably done on a hot plate but may also be done in an oven. In a preferred embodiment, the dielectric is first heated at about 50° C. for about 30 seconds to one minute, then is heated at about 150° C. for about 30 seconds to one minute, and heated a third time at about 250° C. for about 30 seconds to one minute. The liquid dielectric material partially crosslinks and solidifies as a result of such heating.

After the coating is heated, the thickness of the resulting film ranges from about 0.2 to about 3.0 micrometers, preferably from about 0.5 to about 2.5 micrometers, and most preferably from about 0.7 to about 2.0 micrometers. The films produced by this invention generally exhibit a thickness standard deviation less than 2%, and preferably less than 1%, of the average film thickness.

Prior to CMP, the dielectric layer may optionally receive a curing cycle defined at a level and duration necessary to density and change the chemical composition of the dielectric layer. In the preferred curing embodiment, the dielectric layer is heated to cause an incremental mechanical hardening and chemical change in the dielectric composition under temperatures of from about 250° C. to about 1,000° C. for a period of from about 5 minutes to about 240 minutes, more preferably from about 300° C. to about 800° C. for from about 30 minutes to about 120 minutes, and most preferably from about 350° C. to about 450° C. for from about 30 minutes to about 120 minutes to further cure the layer.

In an alternate curing embodiment, the dielectric layer may be exposed to electron beam radiation under conditions sufficient to cure the dielectric material prior to removal of the dielectric layer. The dielectric coated substrate is cured by exposing the surface of the substrate to a flux of electrons while in the presence of a gas selected from the group consisting of oxygen, argon, nitrogen, helium and mixtures thereof, and preferably oxygen, argon, nitrogen, and mixtures thereof Nitrogen gas is more preferred. The temperature at which the electron beam exposure is conducted will depend on the desired characteristics of the resulting film and the length of desired processing time. One of ordinary skill in the art can readily optimize the conditions of exposure to get the claimed results but the temperature will generally be in the range of about 25° C. to about 250° C., and preferably from about 150° C. to about 250° C. The pressure during electron beam curing will range between from about 10 mtorr to about 200 mtorr, and preferably from about 10 mtorr to about 40 mtorr. The period of electron beam exposure will be dependent upon the strength of the beam dosage applied to the substrate. One of ordinary skill in the art can readily optimize the conditions of exposure to get the claimed results, but generally the exposure will range from about 5 to about 45 minutes, and preferably from about 7 to about 15 minutes with application of an electron beam dose of about 2,000 to about 50,000, preferably from about 7,500 to about 10,000 microcoulombs per square cm. The accelerating voltage of the electron beam may range from about 5 to about 15 KeV. The dose and energy selected will be proportional to the thickness of the films to be processed. The dielectric coated substrate may be exposed to electron beams in any chamber having a means for providing electron beam radiation to substrates placed therein. Typically, the chamber is also equipped with a means for emitting electrons into a gaseous atmosphere comprising oxygen, argon, nitrogen, helium and mixtures thereof, and preferably oxygen, argon, and nitrogen, simultaneously with electron beam exposure. In a preferred embodiment, the dielectric coated substrate is placed into a chamber which is commercially available from Electron Vision, San Diego, Calif., under the tradename "ElectronCure"™, the principles of operation and performance characteristics of which are described in U.S. Pat. No. 5,001,178, which is incorporated herein by reference.

After the dielectric layer is optionally cured, one performs a CMP to the dielectric layer according to known techniques. Details of such techniques are well known in the art, see for example, U.S. Pat. No. 5,516,729 which is incorporated herein by reference. In general, the chemical-mechanical polish step is conducted by abrading the dielectric layer with an abrasive powder slurry comprised of an alkali silica, a fumed silica or cerium oxide, using a polishing pad such as a foamed fluorocarbon polishing pad employing a pressure of from about 5 to about 20 lbs/in$^2$, preferably from about 5 to about 10 lbs/in$^2$. The preferred slurry is cerium oxide having a crystallite size of from about 14 to about 100 nm, and preferably from about 14 to about 20 nm. Preferably the slurry composition has a pH range of from about 2.8 to about 11, or more preferably from about 10.3 to about 11. Particularly useful slurry materials nonexclusively include SC112, which is a fumed silica available commercially from Cabot Corporation of Aurora, Ill. and has a pH of 10.3; ILD1300 which is a fumed silica available commercially from Rodel Corporation of Scottsdale, Ariz. and has a pH of 11.0 and SS25 which is a fumed silica available commercially from Cabot Corporation and has a pH of 10.8. Preferably CMP is done with a commercially available polisher such as a Avanti 372 or 472 from IPEC/Westech, having a platen speed of from about 10 to about 100 rpm, preferably from about 25 to about 60 rpm and a downward pressure from a polishing pad to the dielectric surface of from about 5 to about 20 psi, preferably from about 7 to about 11 psi. CMP may be conducted for from about 0.5 to about 60 minutes, preferably from about 0.5 to about 30 minutes. The amount of dielectric layer typically removed depends on the dielectric layer thickness applied.

The dielectric layer is partially removed such that after such portions are removed, the remaining layer is more planar than prior to CMP. The following non-limiting examples serve to illustrate the invention.

EXAMPLE 1

Preparation of SOG Coated Wafers

Six inch diameter silicon wafers are coated with a siloxane SOG, namely Accuglass® 311 available from Allied- Signal Inc., by dispensing 3 to 4 ml of the SOG onto the surface of the wafers. The wafers are then spun on a SOG coater track, manufactured by DNS Inc., for 2 seconds at 72° F. at about 350 rpm. After the coated wafers are additionally spun at 3000 rpm for about 20 seconds under similar conditions, they are then heated on hot plates in the coater track for three consecutive intervals of 120 seconds at 80° C., 120° C. and 175° C.

The coated wafers from step 1 are then cured in a furnace, manufactured by MRL Industries for 1 hour at 425° C. and 1 atmosphere in the presence of nitrogen to produce a cured dielectric layer.

EXAMPLE 2

Thickness of Polished Wafers

The wafers produced in Example 1 are then polished with an Avanti 472 polisher manufactured by IPEC/Westech, with slurries that have pH's ranging from 10.3 pH to 11 pH. Polishing is conducted at a down pressure of 7.0 psi, plate speed of 28 rpm, oscillating at a 5 mm range at speed of 2 mm/minute. Polishing is done at 110° F. using an IC 1000 polishing pad available from Rodel Corporation. The slurry flows at 130 ml/minute. Wafer thicknesses are pre-measured before CMP using a Prometrix instrument manufactured by Tencor at twenty five different locations on the wafers and then the twenty five values are averaged.

Figure 1A:
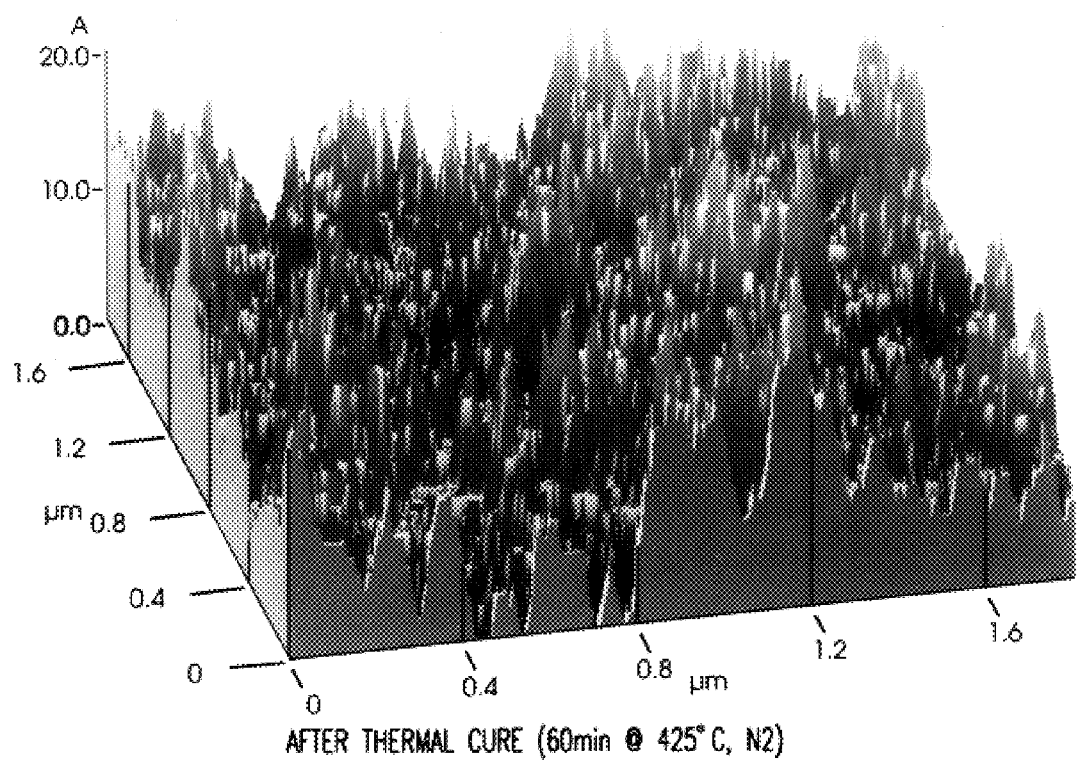
FIG. 1(a) is an atomic force micrograph (AFM) image of a siloxane available from AlliedSignal under the tradename Accuglass® 311 after thermal cure for 60 min. at 425° C. under nitrogen atmosphere, and (b) is the AFM image of the SOG Accuglass® 311 siloxane after being CMP processed with SC-112 brand fumed silica slurry.
Figure 1B:
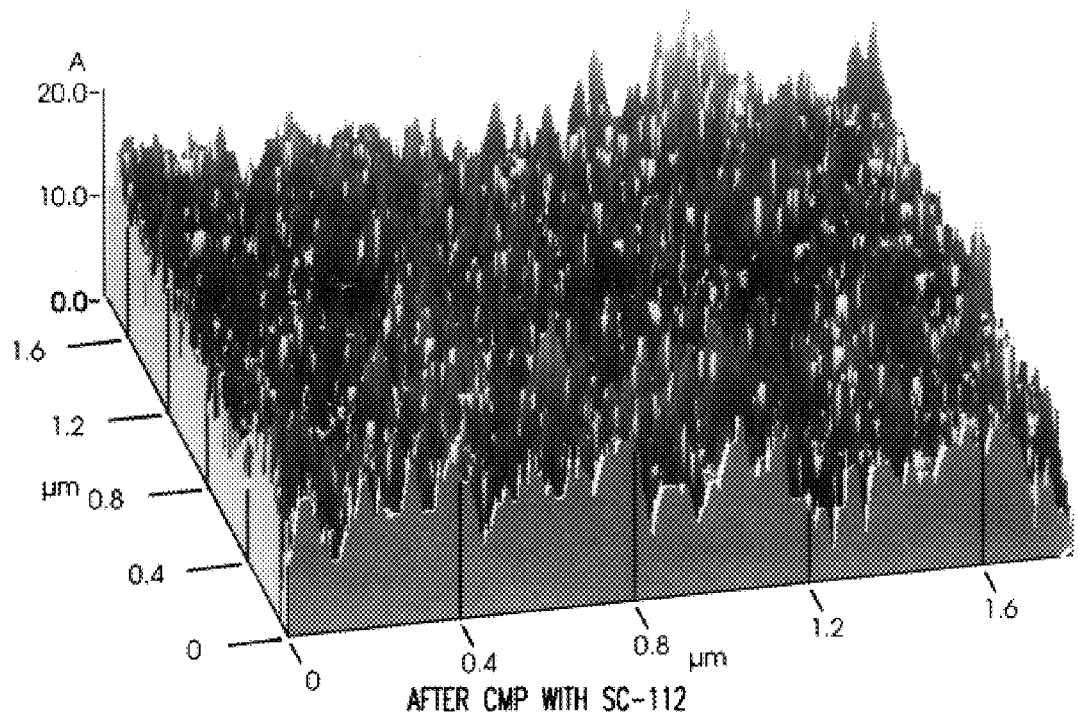
Figure 2:
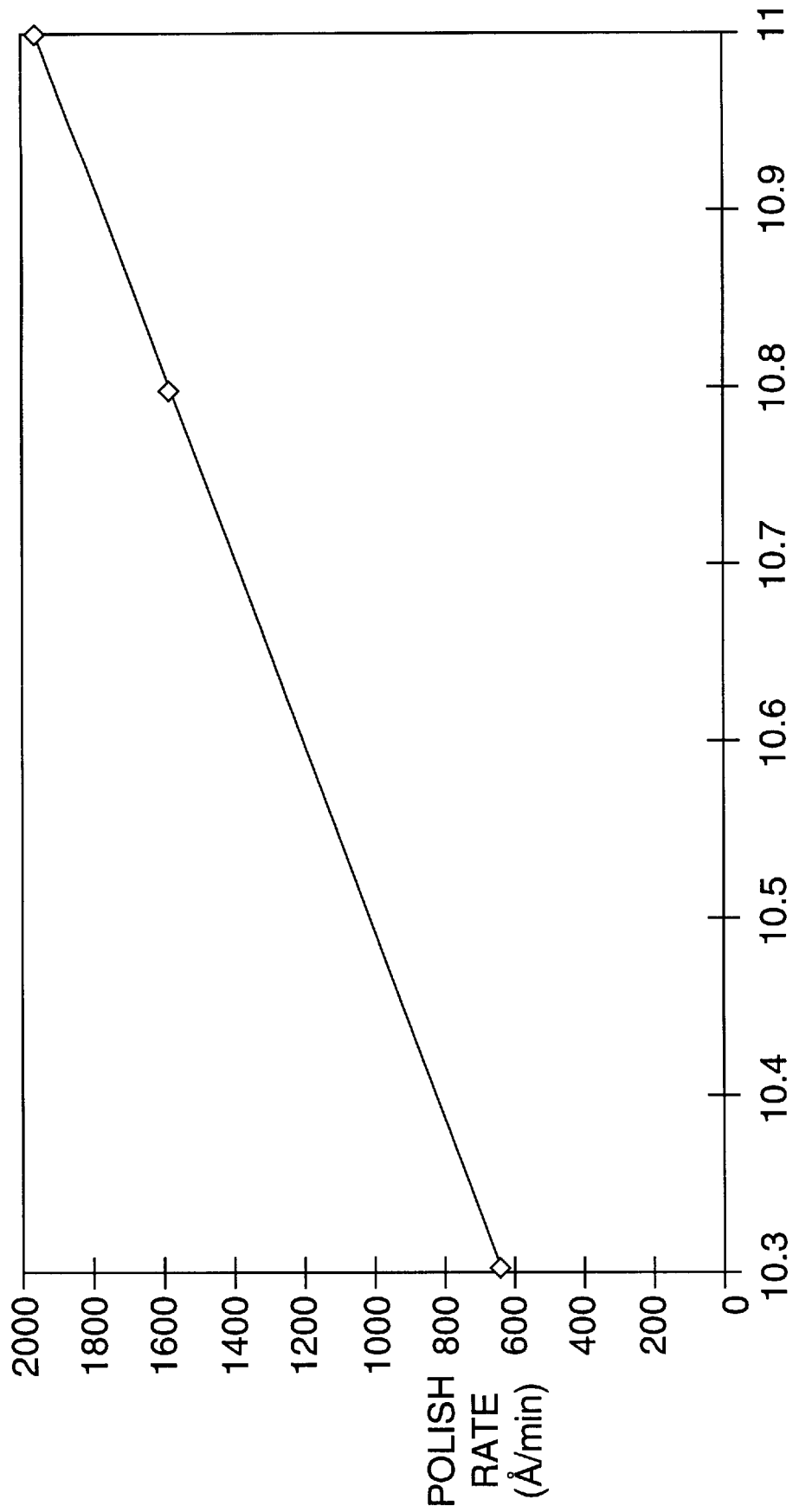
FIG. 2 is a graph of polishing rate (Å/min.) of AlliedSignal SOG Accuglass® 311 siloxane using slurries of varying pH.

Polished SOG coated wafers are then post-measured after CMP for thickness at twenty five different locations on the wafers, then the twenty five values are averaged. The polish rate is obtained by subtracting post-measurement thickness from pre-measurement thickness. Automated calculation is done by the Prometrix instrument. FIG. 1(a) shows an atomic force micrograph (AFM) image of SOG Accuglass® 311 after thermal cure for 60 min. at 425° C. under a nitrogen atmosphere, and (b) is the AFM image of SOG Accuglass® 311 after CMP processed with SC-112 slurry. FIG. 2 shows a graph of polishing rate (Å/min.) of SOG Accuglass® 311, range from 0 to 2000 Å/min. with slurries that have different pH rates from a 10.3 pH to 11 pH.

EXAMPLE 3

Preparation of Wafers With Different Organic Ratios

Figure 3:
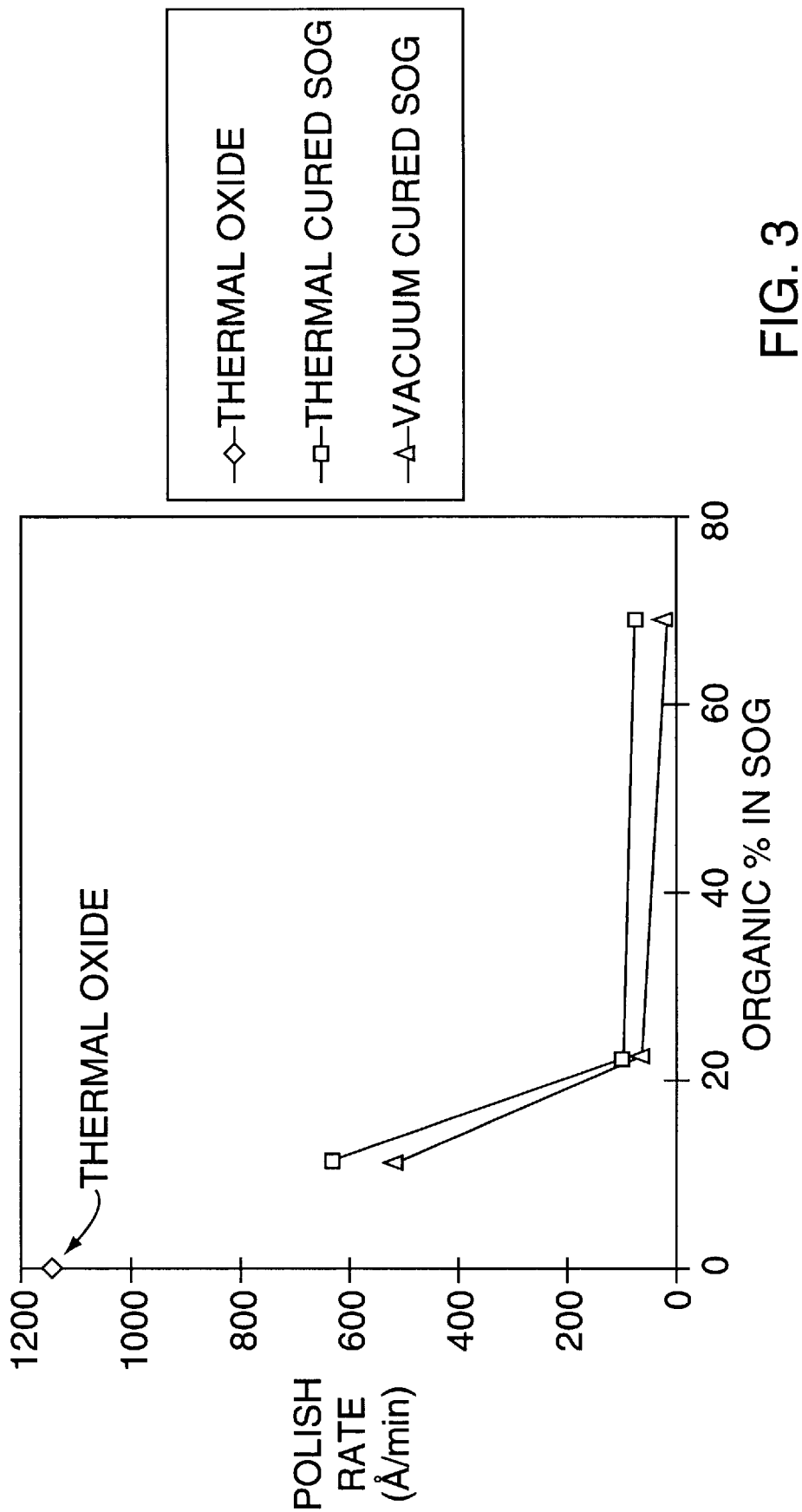
FIG. 3 is a graph of the polishing rate (Å/min.) of substrates coated with thermal oxide, thermally cured SOG siloxane and vacuum cured SOG siloxane using SC-112 slurry at various organic ratios.

A thermal oxide film is grown on a bare Si wafer in a furnace to produce a thermal oxide wafer which is then thermally cured according to the procedure set forth in Example 1. An additional layer of the SOG used in Example 1 is applied thereon according to the procedure of Example 1, then the wafer is cured in a vacuum furnace, manufactured by DNS, to produce vacuum cured SOG wafer. FIG. 3 shows the polishing rate of different dielectric surfaces as a function of percent organic content of the SOG. This example shows the polish rate of thermal oxide film, thermally cured SOG and vacuum cured SOG as a function of organic content in the SOG.

EXAMPLE 4

Preparation of Wafers Using Different SOG Materials

Figure 4A:
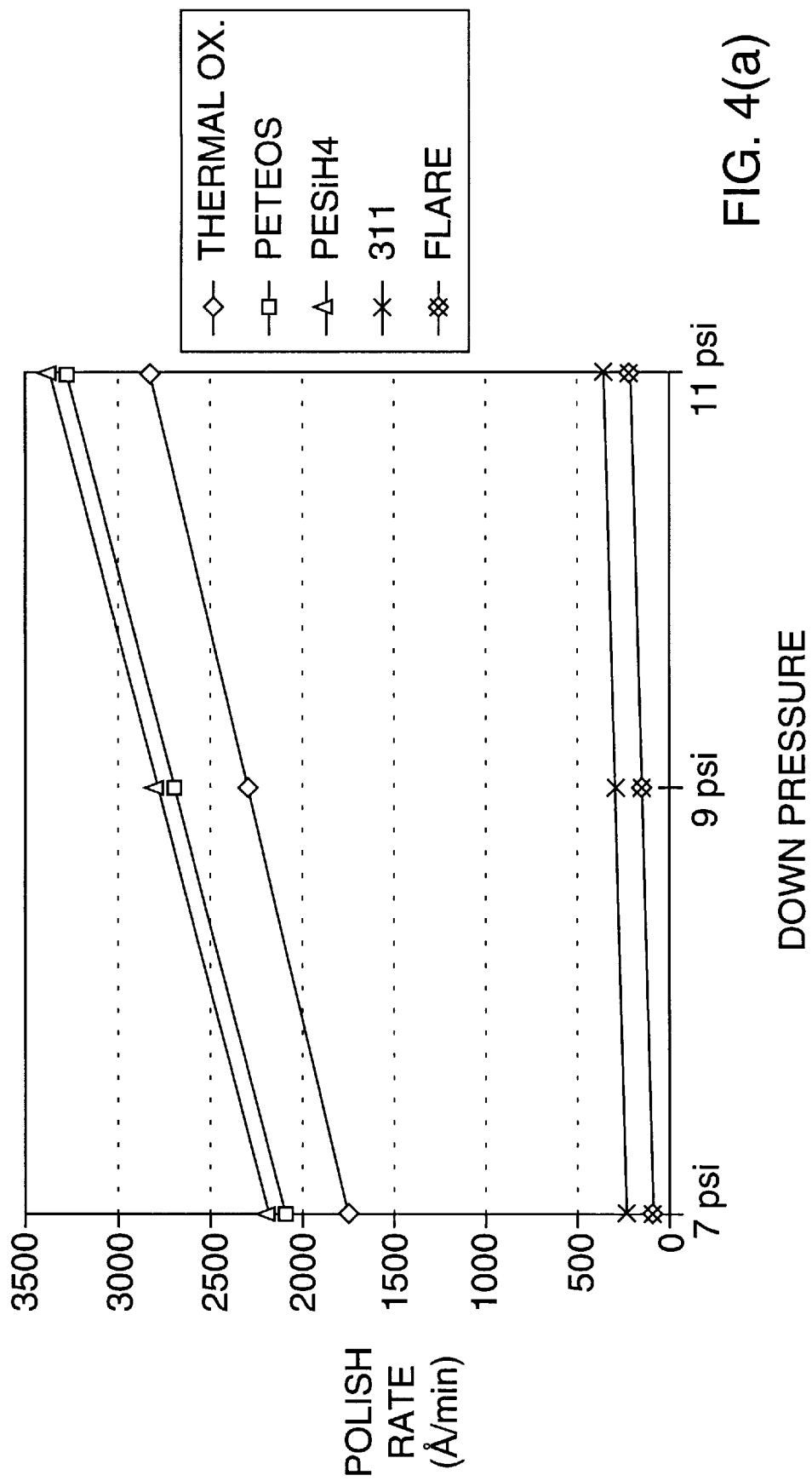
FIGS. 4(a–d) are graphs of the polishing rate (Å/min.) of substrates coated with thermal oxide, PETEOS, PESiH$_4$, Accuglass® 311 siloxane and Flare™ fluorinated poly (arylether) available from AlliedSignal Inc. using SC-112 slurry at varying platen rpm.
Figure 4B:
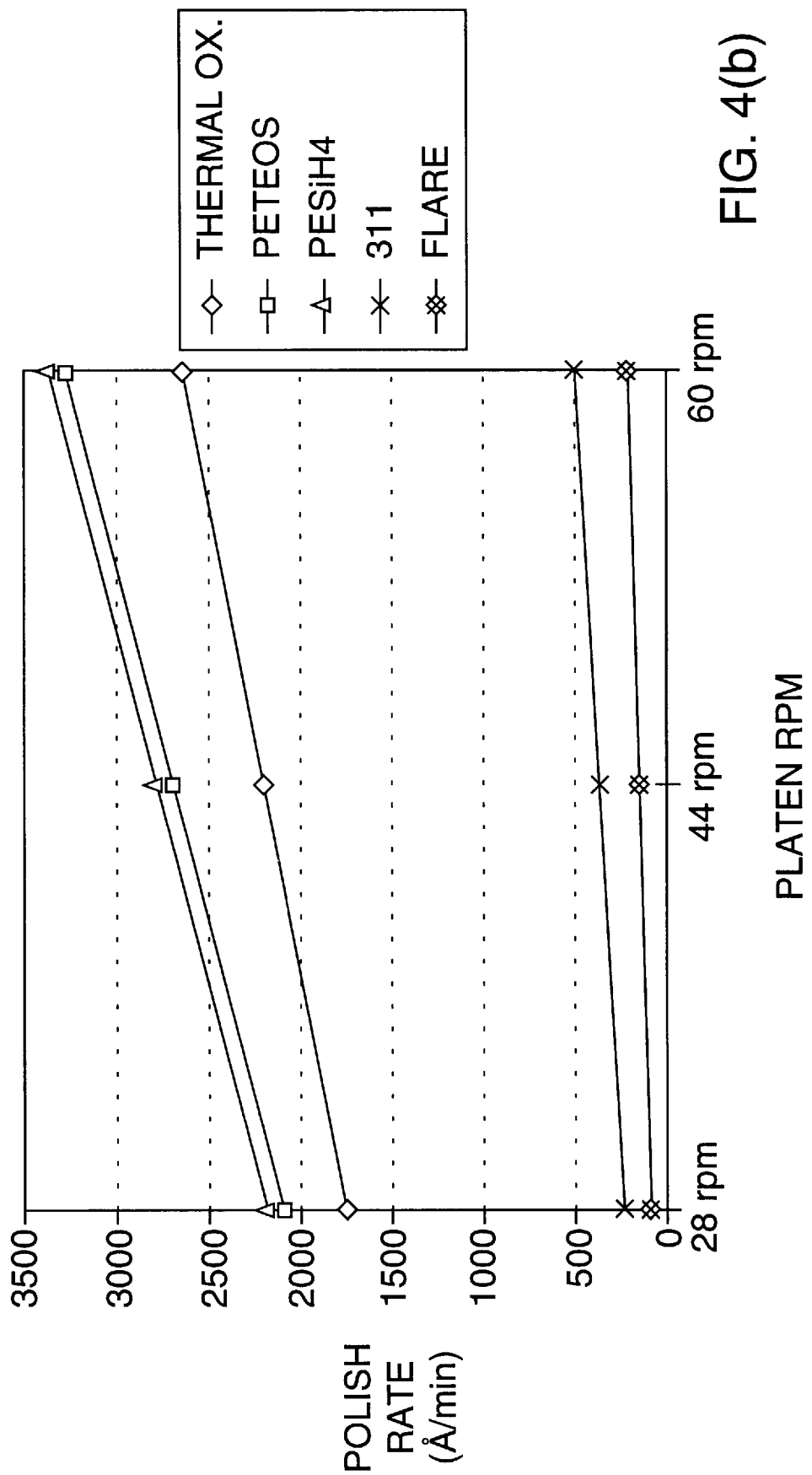
Figure 4C:
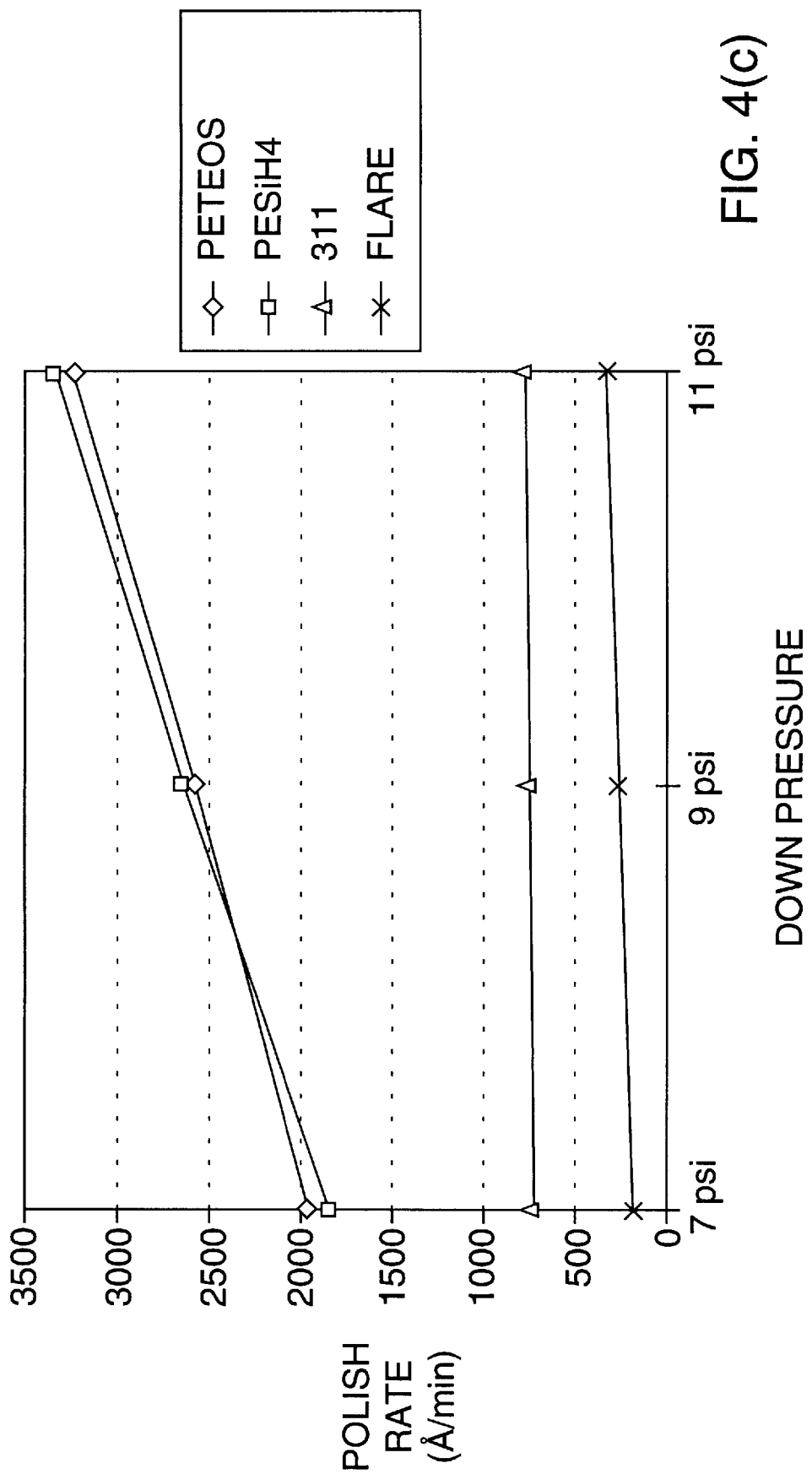

Example 1 is repeated, but with different dielectric SOG materials, namely, a thermal oxide, PETEOS, PESiH$_4$, Accuglass® 311 silane and FLARE™ fluorinated poly (arylether). This example exemplifies CMP polish rates, as shown in FIGS. 4 (a–d), as a function of polishing down pressure and platen rpm for a variety of SOG materials.

EXAMPLE 5

Preparation of Wafers With Different Phosphorus Contents

Figure 5:
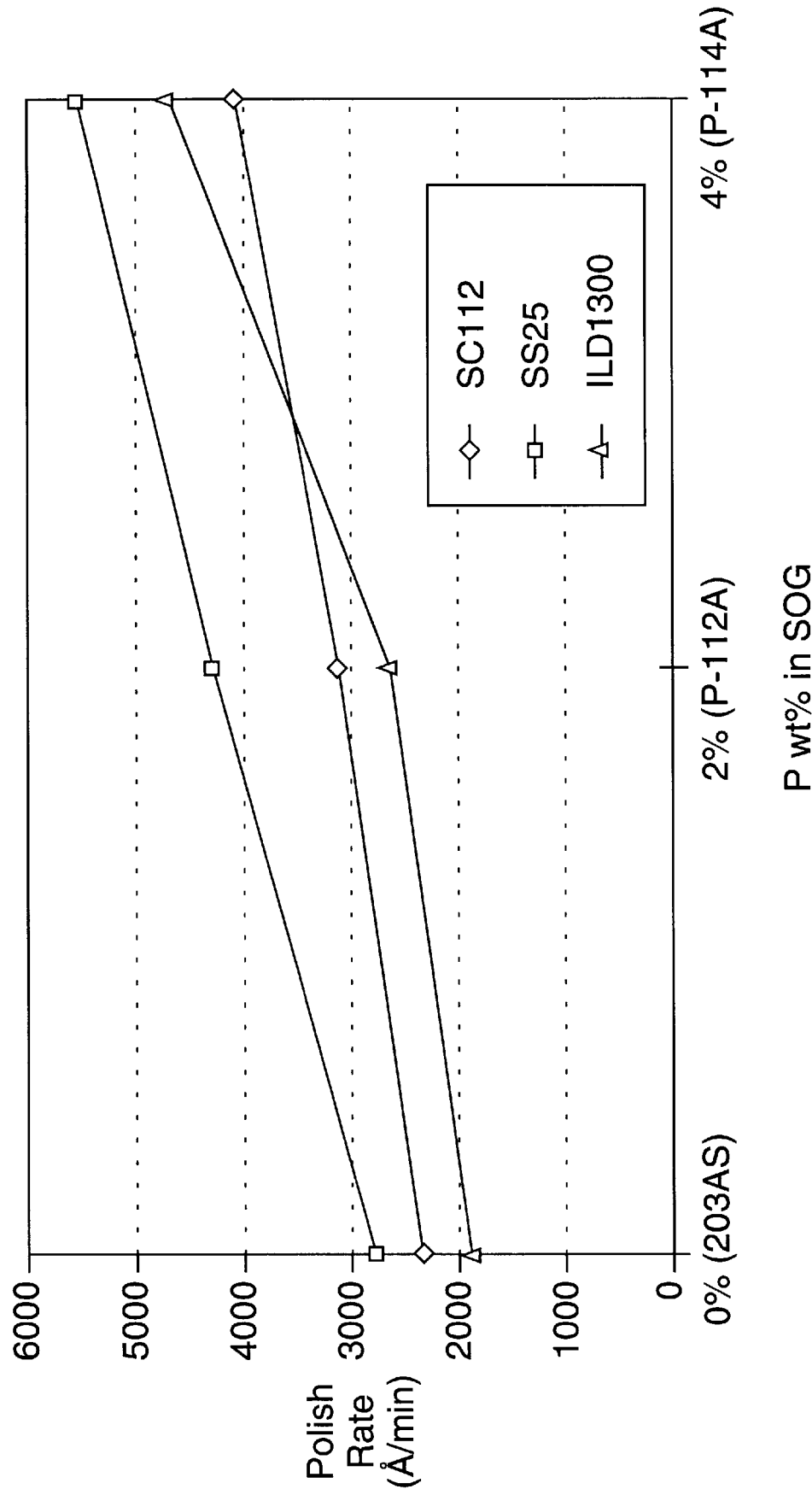
FIG. 5 is a graph of the polishing rate (Å/min.) of silicate SOG material with varying phosphorus content rates using various different slurries.

Example 1 is repeated with different SOG materials having different phosphorous wt. %, which are available from AlliedSignal Inc. under the tradename Accuglass® 203AS, P112A and P114A. The coated wafers are then polished with an Avanti 472 polisher, using SC-112, SS-25 and ILD-1300 slurries. Wafer thickness is pre-measured and post measured as set forth in Example 2. The polishing rate as a function of phosphorus content is shown in FIG. 5. This example shows the use of SOG materials having various phosphorus contents.

EXAMPLE 6

End Point Detection by Preparation of CVD TEOS/ SOG Coated Wafer

The CMP may be conducted through the dielectric layer until an underlying layer is reached. This underlying layer is usually a substrate with metal conductors and an oxide layer. A stopping or end-point is reached when a portion of the desired underlying layer is reached by the CMP.

A layer of TEOS film having a thickness of 2 k Å is applied onto polysilicon wafers via CVD at a temperature of about 350° C. to 400° C. and a pressure at 10 mtorr. The wafers are then similarly deposited with another layer of TEOS film at a thickness of 8 k Å, after the wafer was processed by the method of Example 1.

Figure 6:
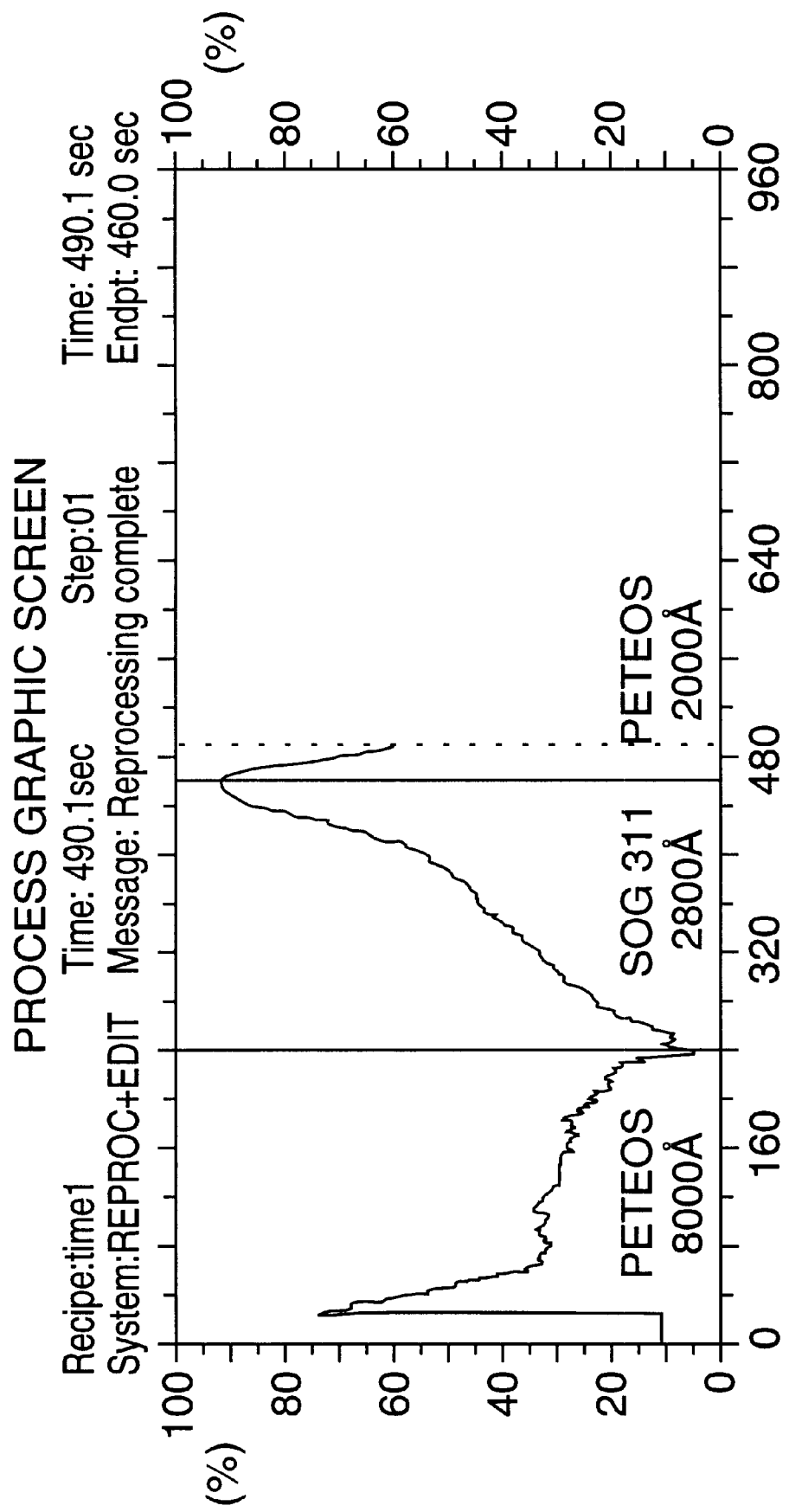
FIG. 6 is a graphic screen of a Luxtron 2350 end point detector monitoring variations of motor current to detect the stop point.

The prepared wafer is polished and monitored by a Luxtron 2350 End-point detection system to observe constant rotational velocity of the wafer polishing head in order to maintain constant a polishing rate. Results are shown in FIG. 6.

EXAMPLE 7

Endpoint Detection of PESiH4 Coated Wafers

Example 6 is repeated but with a different layer of CVD film, PESiH$_4$, to produce test wafers. Then the wafers are polished and monitored by a Luxtron 2350 End-point detection system to observe constant rotational velocity of the wafer polishing head in order to maintain constant polishing rate.

EXAMPLE 8

SEM shows local and global planarization by the SOG/ CMP combined process when Examples 1 and 2 are repeated on a bare unpatterned Si wafer. FIGS. 7(a) and (b) show the surface of the wafers both before and after CMP.

EXAMPLE 9

Example 1 and 2 are repeated except the slurry used for CMP is cerium oxide at a variety of weight percentages in deionized water, pH's and particle sizes, and the dielectric layer is comprised of Accuglass® 311 siloxane, Accuglass® 418 methylsilsesquioxane, Flare™ fluorinated poly (arylether) and TEOS. Polishing rates are measured as set forth in Example 2 and results of which are presented in Table 1.

TABLE 1

| | Slurry | | | Polish Rate (r/min.) | | | |
|---|---|---|---|---|---|---|---|
| Cell* | % CeO | pH | Particle Size | Accuglass ® 311 | Accuglass ® 418 | Flare | TEOS |
| Cell 1 | 10% (+) | 7.0 (+) | 350 nm (+) | 2484 | 9900 | 4000 | 6000 |
| Cell 2 | 10% (+) | 2.8 (−) | 20 nm (−) | 2833 | 165 | 1034 | 740 |
| Cell 3 | 10% (+) | 7.0 (+) | 170 nm (−) | 2490 | 3719 | 5000 | 2120 |
| Cell 4 | 10% (+) | 2.8 (−) | 350 nm (+) | 519 | 4263 | 4655 | 1135 |
| Cell 5 | 3% (−) | 2.8 (−) | 20 nm (−) | 1092 | 1053 | 1295 | 1321 |
| Cell 6 | 3% (−) | 7.0 (+) | 170 nm (−) | 5328 | 10278 | 1650 | 5124 |
| Cell 7 | 3% (−) | 7.0 (+) | 350 nm (+) | 5060 | 2171 | 4380 | 2432 |
| Cell 8 | 3% (−) | 2.8 (−) | 350 nm (+) | 248 | 8172 | 2432 | 1434 |

*cell refers to the cell of the Prometrix measurement instrument.

One of the most important uses for the SOG/CMP process is endpoint control, i.e. operator control of the point at which CMP is ended when the polishing through the dielectric layer reaches an underlying layer. The underlying layer is typically the substrate with metal conductors and an oxide layer. A stopping or end-point is reached when a portion of the underlying layer is reached by the polish operation. The use of the SOG layer as a stop layer in the planarization process is shown in FIG. 8 and FIG. 9, which illustrate a silicon substrate 1 having a pattern of metal contacts 2 thereon, onto which is deposited a CVD layer 3 of PETEOS or PESiH$_4$, followed by a SOG layer 4. FIG. 9 shows an additional CVD exterior layer 5 of PETEOS or PESiH$_4$. The CMP step may be conducted wherein polishing can stop in SOG layer 4, CVD layer 5 or CVD layer 3, depending on the end use.

It will be appreciated to those skilled in the art having the benefit of this disclosure that this invention is capable of applications with multiple levels of interconnect and can be repeated to form interlevel dielectrics between each level of interconnect. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such variations and modifications.

What is claimed is:

1. A process for forming a void-free, continuous planarized dielectric substrate surface comprising:
    (a) spin coating a dielectric composition which comprises a material selected from the group consisting of silicates, phosphosilicates, siloxanes, silsesquioxane, organic polymers, copolymers and mixtures thereof, to a surface of a substrate in an amount sufficient to uniformly coat and fill voids continuously across the surface of the substrate;
    (b) curing said dielectric composition by an electron beam curing treatment; and
    (c) performing a chemical mechanical polishing step to said dielectric composition until said dielectric composition on said substrate surface is substantially planarized and continuous across the surface of the substrate.

2. The process of claim 1 further comprising heating the dielectric composition and substrate at a temperature and for a time sufficient to form a continuous, dry dielectric film on the surface after step (a) but before step (b).

3. The process of claim 2 wherein said dielectric composition is further cured by an additional subsequent heating before step (b) at a temperature of from about 2520 C. to about 250° C.

4. The process of claim 1 wherein the dielectric composition comprises a material selected from the group consisting of phenylsiloxanes, methylsiloxanes, methylphenylsiloxanes, phosphosiloxanes, methyl silsesquioxane, methylphenyl silsesquioxane, fluorinated poly(arylethers), copolymers and mixtures thereof.

5. The process of claim 1 wherein said dielectric composition comprises a siloxane having, based upon the total weight of said siloxane, of from about 2% to about 90% of organic groups comprising alkyl groups having from about 1 to about 10 carbons, aromatic groups having from about 4 to about 10 carbons, aliphatic groups having from about 4 to about 10 carbons, or mixtures thereof.

6. The process of claim 1 wherein said dielectric composition comprises from about 0% to about 10% phosphorus based on the total weight of the dielectric composition.

7. The process of claim 1 wherein said composition has a thickness of from about 500 Å to about 2 microns.

8. The process of claim 1 wherein the substrate comprises silicon or gallium arsenide.

9. The process of claim 1 wherein the chemical mechanical polishing is conducted with an alkali silica slurry.

10. The process of claim 1 wherein the chemical mechanical polishing is conducted with fumed silica slurry or a cerium oxide slurry.

11. The process of claim 1 wherein the chemical mechanical polishing is conducted with a pressure on the dielectric film of from about 10 to about 20 lbs/in$^2$.

12. The process of claim 1 wherein the chemical mechanical polishing is conducted with a slurry composition having a pH range of from about 2.8 to about 11.

13. The process of claim 1 wherein the chemical mechanical polishing is conducted with a slurry composition having a pH range of from about 10.3 to about 11.

14. The process of claim 1 further comprising the subsequent steps of repeating steps (a) and (b) and (c) at least once to the planarized substrate surface.

15. The process of claim 1 wherein the surface comprises a pattern of metallic electrical conductors.

16. The process of claim 1 wherein the surface comprises a pattern of metallic electrical conductors and a layer of an oxide on the metal conductors.

17. The process of claim 1 wherein the surface comprises a pattern of metallic electrical conductors and a layer of an oxide on the metallic conductors and the process further comprises depositing a second oxide layer on the dielectric layer before conducting step (c).

18. A process for treating a semiconductor substrate surface comprising a) spin depositing a layer of a liquid dielectric composition which comprises a material selected from the group consisting of silicates, phosphosilicates, siloxanes, silsesquioxane, organic polymers, copolymers and mixtures thereof, continuously across a surface of a semiconductor substrate;

b) heating said dielectric layer at a temperature and for a time sufficient to form a continuous, dry dielectric layer on the surface;

c) curing said dielectric composition by an electron beam curing treatment; and d) chemical-mechanical polishing the dielectric layer to remove at least a portion of the dielectric layer and produce a substantially planarized and continuous dielectric layer across the surface of the substrate.

* * * * *